(12) United States Patent
Asai

(10) Patent No.: US 7,271,459 B2
(45) Date of Patent: Sep. 18, 2007

(54) PHYSICAL QUANTITY SENSOR

(75) Inventor: Makoto Asai, Kariya (JP)

(73) Assignee: DENSO Corporation, Kariya (JP)

( * ) Notice: Subject to any disclaimer, the term of this patent is extended or adjusted under 35 U.S.C. 154(b) by 0 days.

(21) Appl. No.: 11/169,583

(22) Filed: Jun. 30, 2005

(65) Prior Publication Data

US 2006/0008935 A1    Jan. 12, 2006

(30) Foreign Application Priority Data

Jul. 6, 2004    (JP)    .............................. 2004-199738
May 31, 2005   (JP)    .............................. 2005-160599

(51) Int. Cl.
*H01L 29/84*    (2006.01)
(52) U.S. Cl. ..................... 257/417; 257/254; 438/700
(58) Field of Classification Search ................ 257/254, 257/417; 438/700
See application file for complete search history.

(56) References Cited

U.S. PATENT DOCUMENTS

| 5,455,383 | A | * | 10/1995 | Tanaka ......................... 174/36 |
| 5,661,712 | A | * | 8/1997 | Chiba .......................... 369/116 |
| 5,987,989 | A | * | 11/1999 | Yamamoto et al. ...... 73/514.24 |
| 6,399,516 | B1 | | 6/2002 | Ayon |
| 6,756,310 | B2 | * | 6/2004 | Kretschmann et al. ...... 438/694 |
| 7,105,902 | B2 | * | 9/2006 | Asami et al. ............... 257/415 |
| 2005/0112843 | A1 | * | 5/2005 | Fischer et al. .............. 438/455 |

* cited by examiner

*Primary Examiner*—Michelle Estrada
*Assistant Examiner*—Nicholas Tobergte
(74) *Attorney, Agent, or Firm*—Posz Law Group, PLC

(57) ABSTRACT

A physical quantity sensor includes: a semiconductor substrate; a cavity disposed in the substrate and extending in a horizontal direction of the substrate; a groove disposed on the substrate and reaching the cavity; a movable portion separated by the cavity and the groove so that the movable portion is movably supported on the substrate; and an insulation layer disposed on a bottom of the movable portion so that the insulation layer provides a roof of the cavity.

3 Claims, 15 Drawing Sheets

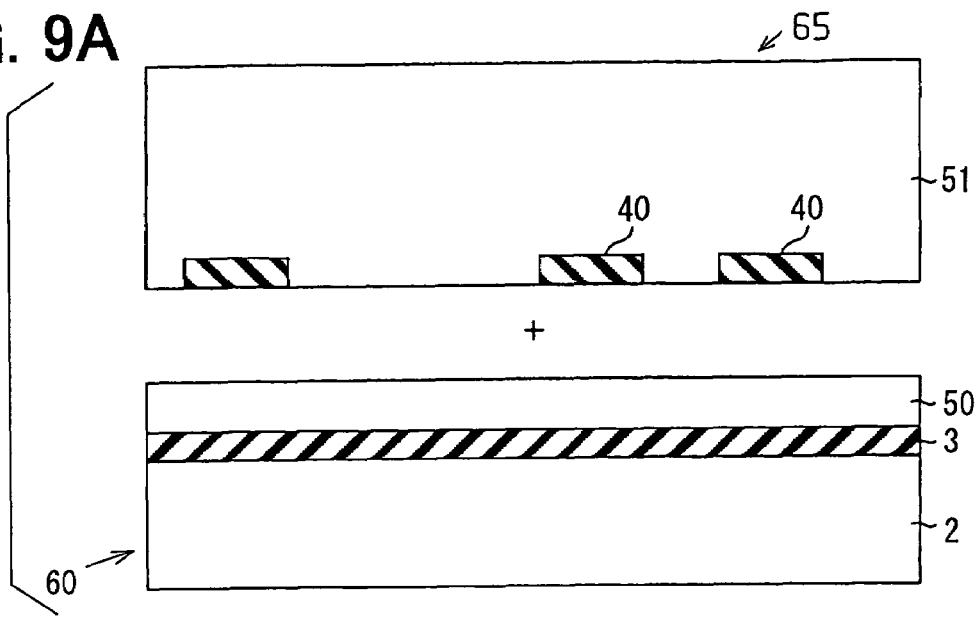
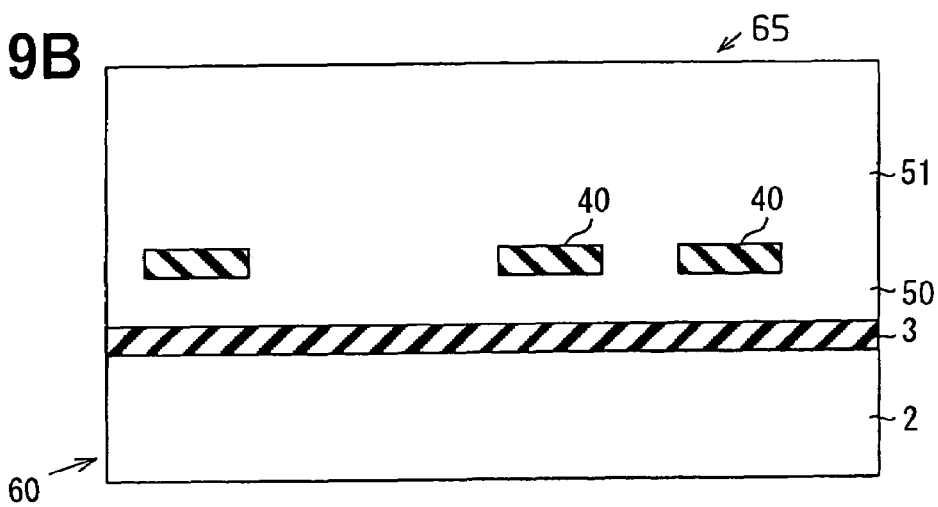
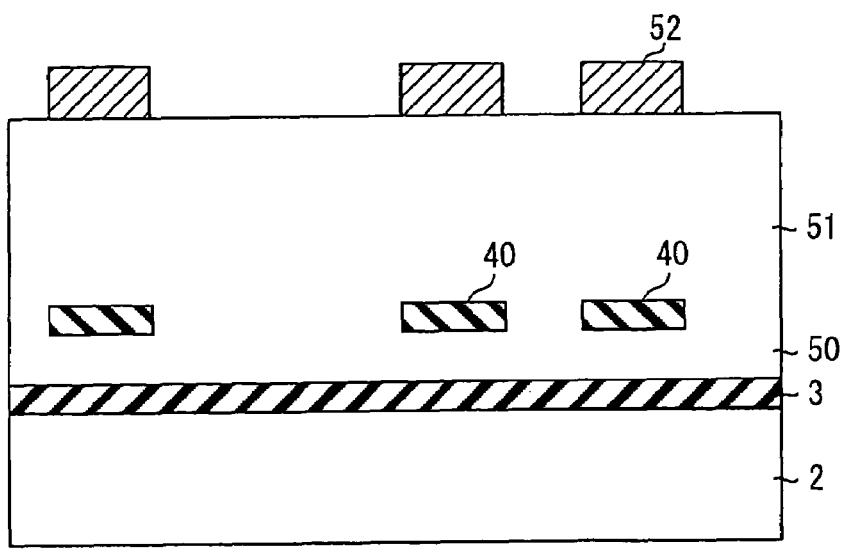

PHYSICAL QUANTITY SENSOR

CROSS REFERENCE TO RELATED APPLICATIONS

This application is based on Japanese Patent Applications No. 2004-199738 filed on Jul. 6, 2004, and No. 2005-160599 filed on May 31, 2005, the disclosures of which are incorporated herein by references.

FIELD OF THE INVENTION

The present invention relates to a physical quantity sensor. Further, the present invention relates to a method for manufacturing a physical quantity sensor.

BACKGROUND OF THE INVENTION

A semiconductor physical quantity sensor having a beam structure in a semiconductor substrate is manufactured by using a micro machining method. This type of sensor is disclosed in, for example, U.S. Pat. No. 6,399,516. When the sensor is manufactured, as shown in FIG. 20A, a SOI substrate is used. The SOI substrate includes a silicon substrate 200, an embedded oxide film 201 and a silicon layer 202, which are stacked in this order. The silicon layer 202 in the SOI substrate is etched so that a groove 210 as a trench is formed in the silicon layer 202. The groove 210 reaches the embedded oxide film 201. As shown in FIG. 20B, the etching process for etching the groove 210 continues to perform, so that a part of the silicon layer is etched and removed, the part of the silicon layer 202 disposed under a movable-portion-to-be-formed region. Specifically, the part of the silicon layer 202 is etched in the horizontal direction. Thus, a predetermined clearance L is formed between the silicon layer 202 and the embedded oxide film 201 so that the movable portion in a beam structure is formed. The movable portion can be movable, since the movable portion is separated from the embedded oxide film 201 by a predetermined clearance L.

The clearance L between the movable portion and the embedded oxide film 201 is controlled by an etching time. However, it is difficult to control the clearance L accurately. Specifically, as shown in FIG. 21A, the aspect ratio of the trench affects the etching rate of the silicon layer 202. Here, the aspect ratio is a ratio between a depth D of the trench and a width W of the trench. When the aspect ratio of the trench is different, the etching amount X of the silicon layer 202 in the horizontal direction is different, as shown in FIG. 21B. Therefore, the cross section of the movable portion in the beam structure does not become a rectangular shape. Thus, as shown in FIG. 21C, the thickness T of the movable portion in the beam structure becomes inhomogeneous in accordance with the pattern around the movable portion. Thus, it is difficult to control the capacitance and the like accurately, so that the device design is restricted.

SUMMARY OF THE INVENTION

In view of the above-described problem, it is an object of the present invention to provide a semiconductor physical quantity sensor with homogeneous movable portion. It is another object of the present invention to provide a method for manufacturing a semiconductor physical quantity sensor with homogeneous movable portion.

A physical quantity sensor includes: a semiconductor substrate; a cavity disposed in the substrate and extending in a horizontal direction of the substrate; a groove disposed on the substrate and reaching the cavity; a movable portion separated by the cavity and the groove so that the movable portion is movably supported on the substrate; and an insulation layer disposed on a bottom of the movable portion so that the insulation layer provides a roof of the cavity.

In the above sensor, the height of the movable portion is constant so that the shape of the movable portion is accurately formed. Thus, the sensor has the homogeneous movable portion.

Further, a physical quantity sensor includes: a support substrate; an embedded insulation film disposed on the substrate; a semiconductor layer disposed on the embedded insulation film; a cavity disposed between the semiconductor layer and the embedded insulation film and extending in a horizontal direction of the substrate; a groove portion disposed in the semiconductor layer and reaching the cavity; and a movable portion disposed in the semiconductor layer and separated from the embedded insulation film by the cavity and the groove portion. The movable portion includes an intermediate insulation layer disposed on a bottom of the movable portion.

In the above sensor, the height of the movable portion is constant so that the shape of the movable portion is accurately formed. Thus, the sensor has the homogeneous movable portion.

Further, a method for manufacturing a physical quantity sensor, which includes a multi-layered substrate, a cavity, a groove and a movable portion, is provided as follows. Here, the multi-layered substrate includes a support substrate, an embedded insulation film and a semiconductor layer, which are stacked in this order. The cavity is disposed between the semiconductor layer and the embedded insulation film and extends in a horizontal direction of the substrate. The groove is disposed in the semiconductor layer and reaches the cavity. The movable portion is disposed in the semiconductor layer and separated from the embedded insulation film by the cavity and the groove portion. The method includes the steps of: preparing the multi-layered substrate in such a manner that an intermediate insulation layer is disposed in the semiconductor layer at a predetermined position to be a bottom of the movable portion; forming the groove from a top surface of the semiconductor layer so that the groove extends in a vertical direction of the multi-layered substrate and reaches the embedded insulation film; and etching a part of the semiconductor layer disposed between the embedded insulation film and the intermediate insulation layer from a bottom of the groove by a dry-etching method with using the embedded insulation film and the intermediate insulation layer as an etching stopper so that the cavity is formed to extend in the horizontal direction of the multi-layered substrate.

The above method provides the sensor having a constant height of the movable portion so that the shape of the movable portion is accurately formed. Thus, the sensor has the homogeneous movable portion.

Further, a method for manufacturing a physical quantity sensor, which includes a semiconductor substrate, a cavity, a groove and a movable portion, is provided as follows. Here, the cavity is disposed in the substrate and extends in a horizontal direction of the substrate. The groove is disposed on a surface of the substrate and reaches the cavity. The movable portion is separated by the groove and the cavity so that the movable portion is movably supported by the substrate. The method includes the steps of: preparing the semiconductor substrate including an intermediate insulation layer embedded in the substrate at a predetermined position of a movable-portion-to-be-formed region; etching a top surface of the semiconductor substrate so that the groove is formed, wherein the groove extends in a vertical direction of the substrate and penetrates the intermediate insulation layer; isotropically etching the semiconductor substrate from a bottom of the groove by using the intermediate insulation layer as an etching stopper so that the cavity extending in the horizontal direction of the substrate is formed for providing the movable portion.

The above method provides the sensor having a constant height of the movable portion so that the shape of the movable portion is accurately formed. Thus, the sensor has the homogeneous movable portion.

BRIEF DESCRIPTION OF THE DRAWINGS

The above and other objects, features and advantages of the present invention will become more apparent from the following detailed description made with reference to the accompanying drawings. In the drawings:

FIGS. 9A to 9C are cross sectional views explaining a method for manufacturing a semiconductor acceleration sensor according to a first modification of the preferred embodiment;

DETAILED DESCRIPTION OF THE PREFERRED EMBODIMENTS

First Embodiment

Figure 1:
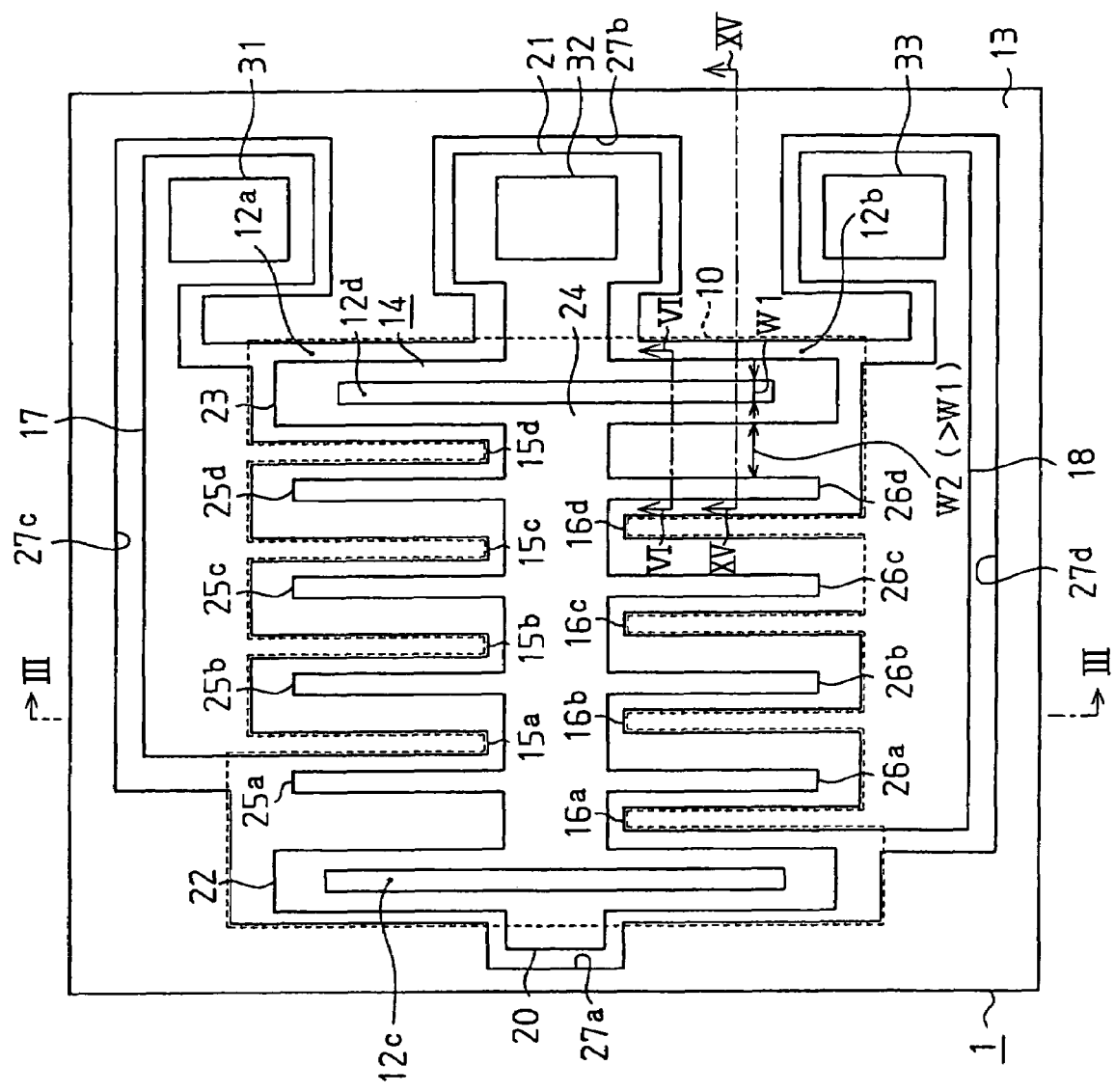
FIG. 1 is a plan view showing a semiconductor acceleration sensor according to a preferred embodiment of the present invention.
Figure 2:
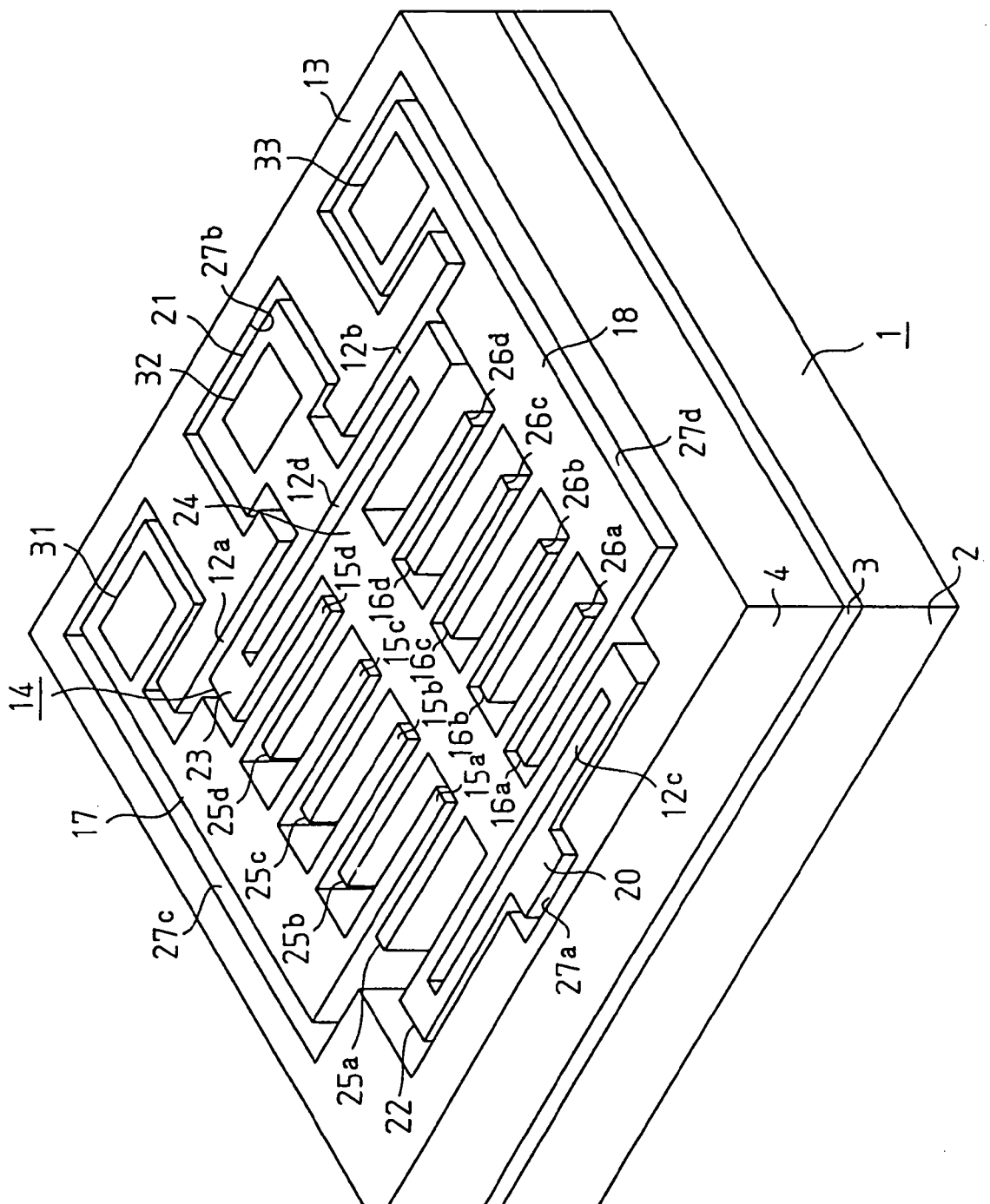
FIG. 2 is a perspective view showing the sensor according to the preferred embodiment.
Figure 3:
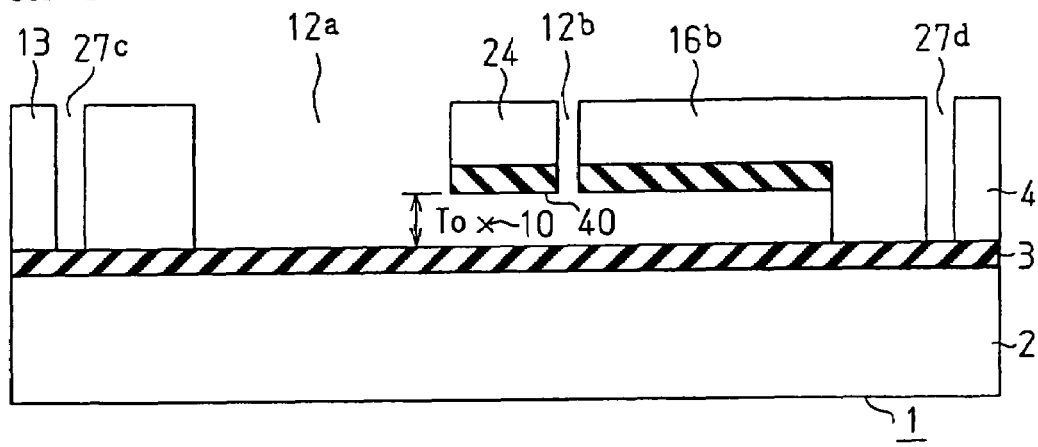
FIG. 3 is a cross sectional view showing the sensor taken along line III-III in FIG. 1.

A semiconductor acceleration sensor according to a preferred embodiment of the present invention is shown in FIGS. 1 to 3. As shown in FIG. 3, the sensor includes a multi-layered substrate 1, which is made of SOI substrate. The multi-layered substrate 1 includes a silicon substrate 2, an embedded oxide film 3, and a silicon layer 4, which are stacked in this order. Specifically, the silicon layer 4 is disposed on the silicon substrate 2 through the embedded oxide film 3. The embedded oxide film 3 is made of $SiO_2$ film. A cavity 10 is formed between the silicon layer 4 and the embedded oxide film 3. The cavity 10 has a predetermined thickness $T_0$. Further, the cavity 10 extends in a horizontal direction, i.e., a lateral direction of the multi-layered substrate 1. In FIG. 1, a cavity formation region is shown as a broken line.

Grooves 12a-12d are formed in the silicon layer 4 of the multi-layered substrate 1. Specifically, the grooves 12a-12d are formed over the cavity 10. The grooves 12a-12d extend in the vertical direction so that the grooves 12a-12d reach the cavity 10. Other grooves 27a-27d are formed in the silicon layer 4, which is disposed neighboring to the cavity 10. The grooves 27a-27d extend in the vertical direction so that the grooves 27a-27d reach the embedded oxide film 3. The cavity 10 and the grooves 12a-12d, 27a-27d separate a square frame 13, a beam structure 14, fixed electrodes 15a-15d, 16a-16d, and fixed electrode lead portions 17, 18. The square frame 13 is composed of a sidewall of the multi-layered substrate 1.

In FIGS. 1 and 2, the beam structure 14 includes anchors 20, 21, beams 22, 23, weight portion 24, and movable electrodes 25a-25d, 26a-26d. No cavity 10 is formed under the anchors 20, 21 so that the anchors 20, 21 are fixed on the substrate 2. The cavity 10 is formed under the beams 22, 23, the weight portion 24, and the movable electrodes 25a-25d, 26a-25d. The weight portion 24 is connected and supported by the anchors 20, 21 through the beams 22, 23. Four movable electrodes 26a-26d protrude from the one side of the weight portion 24. Other four movable electrodes 26a-26d protrude from the other side of the weight portion 24. The movable electrodes 25a-25d, 26a-26d provide a comb teeth shape, which extends in parallel by a predetermined interval. The beams 22, 23, the weight portion 24 and the movable electrodes 25a-25d, 26a-26d provide a movable portion. The weight portion 24 and the movable electrodes 25a-25d, 26a-26d are displaceable in a direction, which is parallel to the surface of the substrate 2. Specifically, they are movable in the right-left direction in FIG. 1 so that they are moved in accordance with acceleration applied to the sensor.

The fixed electrodes 15a-15d face the movable electrodes 25a-25d. Specifically, one side of each fixed electrode 15a-15d faces one side of the movable electrode 25a-25d. Similarly, the fixed electrodes 16a-16d face the movable electrodes 26a-26d. Specifically, one side of each fixed electrode 16a-16d faces one side of the movable electrode 26a-26d. The square frame 13 and the anchors 20, 21 of the beam structure 14 are electrically separated by the grooves 27a, 27b. Specifically, the movable electrodes 25a-25d, 26a-26d of the beam structure 14 are isolated by air isolation method. Similarly, the square frame 13 and the fixed electrode lead portion 17 are electrically isolated by the groove 27c. Further, the square frame 13 and the fixed electrode lead portion 18 are electrically isolated by the groove 27d. Thus, two fixed electrodes 15a-158d, 16a-16d are isolated by the air isolation method, respectively.

The fixed electrodes 15a-15d, 16a-16d are electrically connected to an external circuit through pads 31, 33 disposed on the fixed electrode lead portions 17, 18, respectively. The movable electrodes 25a-25d, 26a-26d are electrically connected to an external circuit through pad 32 disposed on the anchor 21.

Thus, in the sensor, as shown in FIG. 3, the multi-layered substrate 1 as the SOI substrate includes the silicon substrate as the support substrate, the embedded oxide film 3 as the embedded insulation film and the silicon layer 4 as the semiconductor layer, which are stacked in this order. The cavity 10 extends in the horizontal direction, and disposed between the silicon layer 4 and the embedded oxide film 3. The grooves 12a-12d are disposed in the silicon layer 4, and reach the cavity 10 so that the movable portion composed of the beams 22, 23, the weight portion 24, and the movable electrodes 25a-25d, 26a-26d is formed in the silicon layer 4. Further, each groove 12a-12d has different width. For example, in FIG. 1, the width W1 of the groove 12d at the beam 23 is smaller than the width W2 of the groove between the movable electrode 26d and the beam 23.

As shown in FIG. 3, an intermediate silicon oxide layer as an insulation film is disposed on the roof of the cavity 10, i.e., the bottom of the movable portion.

The first capacitor is formed between the movable electrodes 25a-25d and the fixed electrodes 15a-15d. Further, the second capacitor is formed between the movable electrodes 26a-26d and the foxed electrodes 16a-16d. The distance between the movable electrodes 25a-25d and the fixed electrodes 15a-15d and the distance between the movable electrodes 26a-26d and the fixed electrodes 16a-16d are changeable differentially so that the capacitances of two capacitors are also differentially changeable. The acceleration is measured on the basis of these capacitance changes.

Figure 4A:
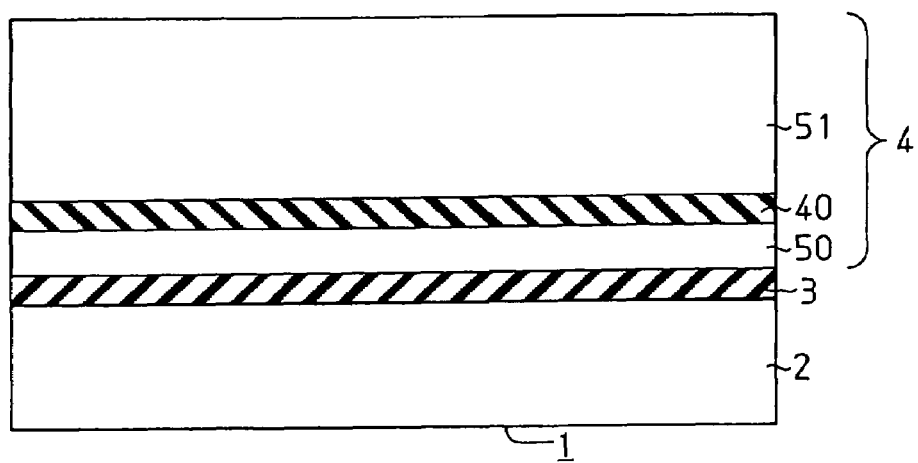
FIGS. 4A and 4B are cross sectional views explaining a method for manufacturing the sensor according to the preferred embodiment.
Figure 4B:
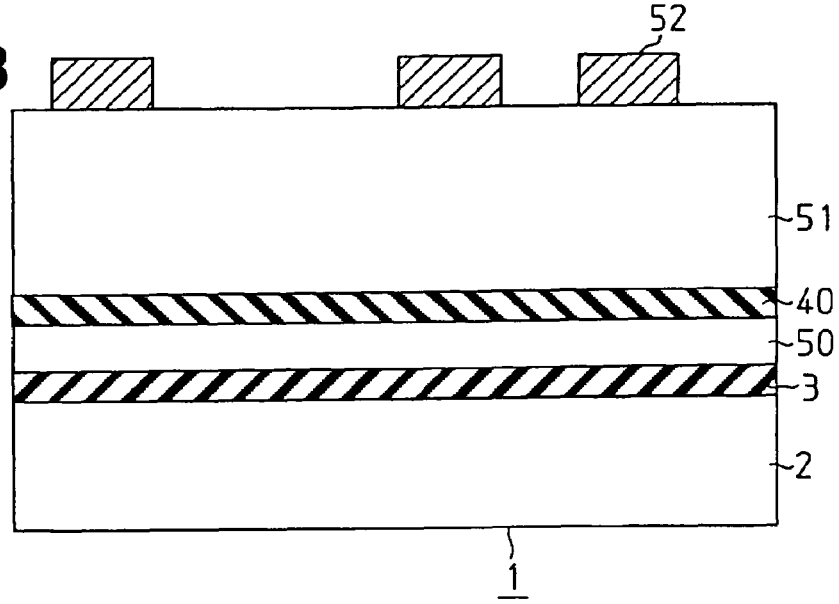

The method for manufacturing the semiconductor acceleration sensor is described as follows with reference to FIGS. 4A to 6. As shown in FIG. 4A, the embedded oxide film 3, the first silicon layer 50, the intermediate silicon oxide layer, and the second silicon layer 51 are formed on the silicon substrate 2 in this order. Thus, the multi-layered substrate 1 is obtained. The first silicon oxide film 40 as a roof insulation film is embedded in the multi-layered substrate 1. The intermediate silicon oxide layer provides the roof of the cavity 10. Then, as shown in FIG. 4B, a mask 52 is formed and patterned on the multi-layered substrate 1, i.e., the top of the second silicon layer 51.

Figure 5A:
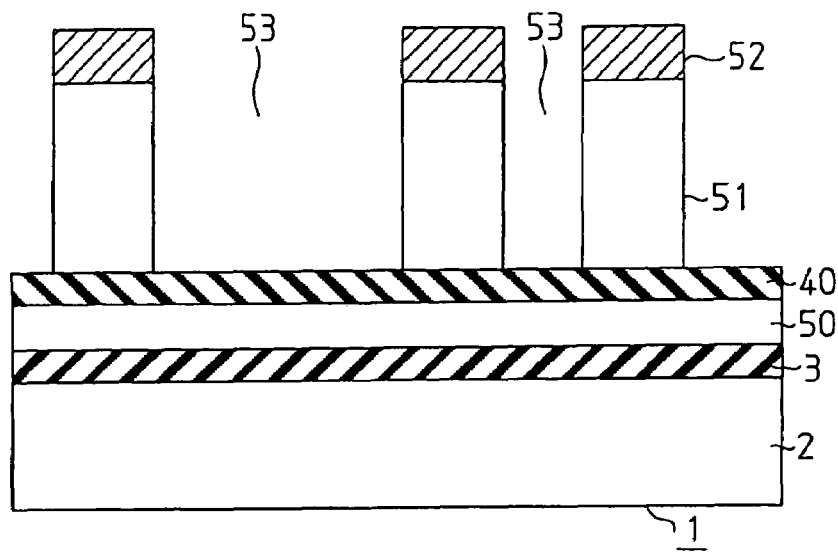
FIGS. 5A to 5C are cross sectional views explaining the method for manufacturing the sensor according to the preferred embodiment.
Figure 5B:
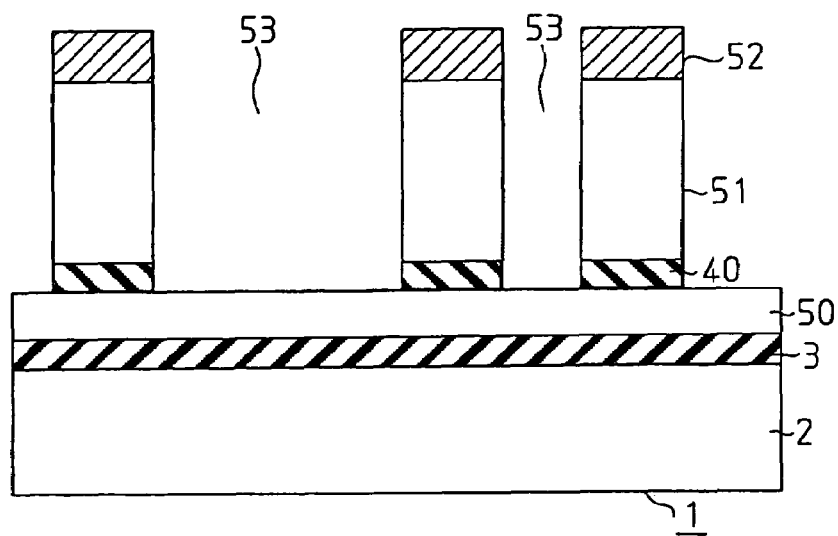
Figure 5C:
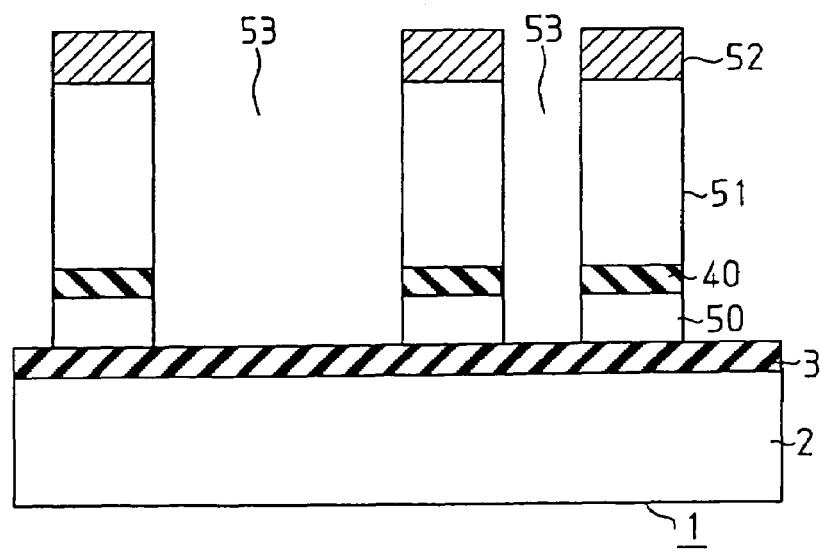

Then, as shown in FIG. 5A, the second silicon layer 51 is etched by a dry-etching method with using the mask 52 so that a groove 53 is formed. The groove 53 reaches the intermediate silicon oxide layer. As shown in FIG. 5B, etching gas as an etching particle is changed so that the intermediate silicon oxide layer is removed. Specifically, exposed intermediate silicon oxide layer is removed so that the first silicon layer 50 is exposed. Further, as shown in FIG. 5C, the etching gas is changed again so that the exposed first silicon layer 50 is removed. Thus, the embedded oxide film 3 is exposed.

Thus, the groove 53 is formed from the surface of the silicon layer 4 including the first silicon layer 51, the intermediate silicon oxide layer and the second silicon layer 50 by the trench etching method. The groove 53 extends in the vertical direction and reaches the embedded oxide film 3. Further, the grooves 27a-27d are formed in the silicon layer 4.

Figure 6:
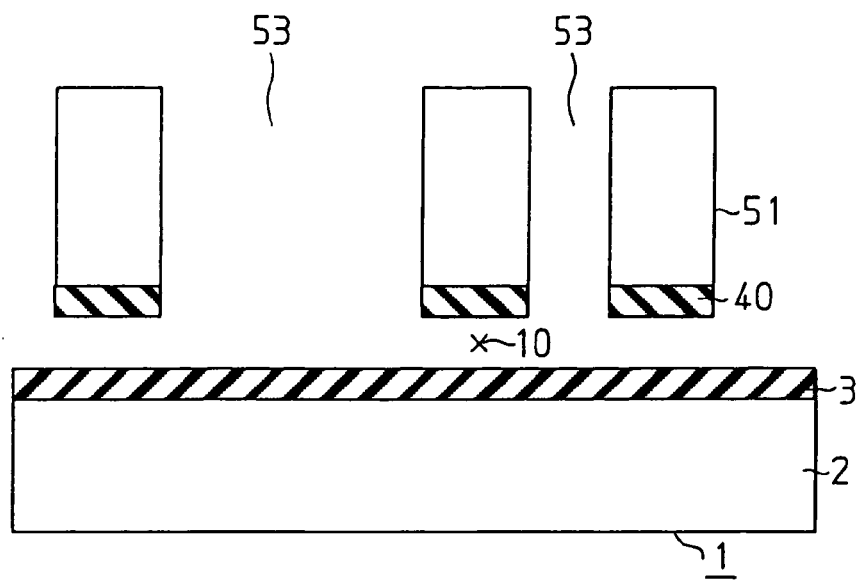
FIG. 6 is a cross sectional view explaining the method for manufacturing the sensor according to the preferred embodiment.

As shown in FIG. 6, the first silicon layer 50 between the embedded oxide film 3 and the intermediate silicon oxide layer is selectively etched and removed. Thus, the first silicon layer 50 between the embedded oxide film 3 and the intermediate silicon oxide layer as the roof insulation film is etched from the bottom of the groove 53 by the dry-etching method with using the embedded oxide film 3 and the intermediate silicon oxide layer as an etching stopper. Thus, the cavity 10 extending in the horizontal direction is formed so that the movable portion of the beam structure 14 is formed.

Next, etching process for the forming the cavity 10 is described with reference to FIGS. 7 and 8.

Figure 7:
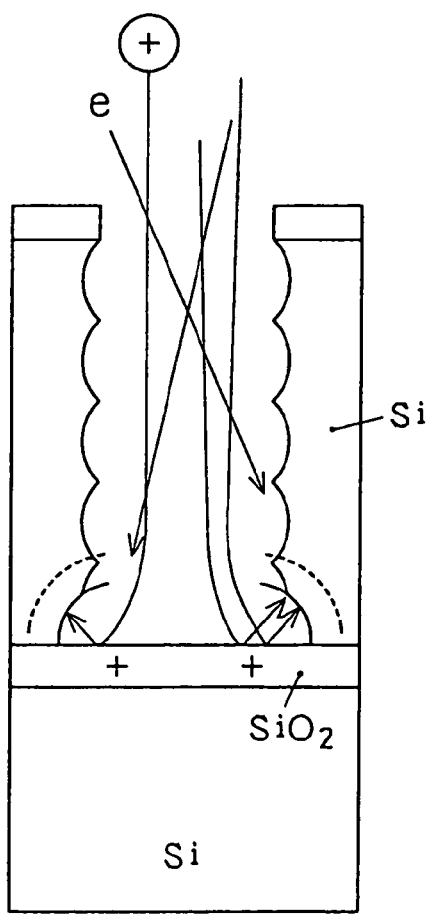
FIG. 7 is a partially enlarged cross sectional view explaining an etching process in the method for manufacturing the sensor according to the preferred embodiment.

As shown in FIG. 7, when a silicon layer is etched in a trench etching process, firstly, a groove is formed from the surface of the silicon layer. Then, the groove reaches an oxide film, i.e., $SiO_2$ film. After the groove reaches the oxide film, the sidewall of the silicon layer near the bottom of the groove is etched in a horizontal direction. This is called a notch effect. This notch effect for etching in the horizontal direction is described as follows. Angle distribution of an electron is different from that of anion. Specifically, the ion goes straight substantially. Thus, the exposed oxide film charges positively. This charge up of the bottom of the oxide film generates difference in potential. The track of the etching ion is bent by the difference in potential near the oxide film. Thus, the ion goes toward the sidewall of the groove. Thus, the silicon layer near the oxide film is etched in the horizontal direction.

Figure 8:
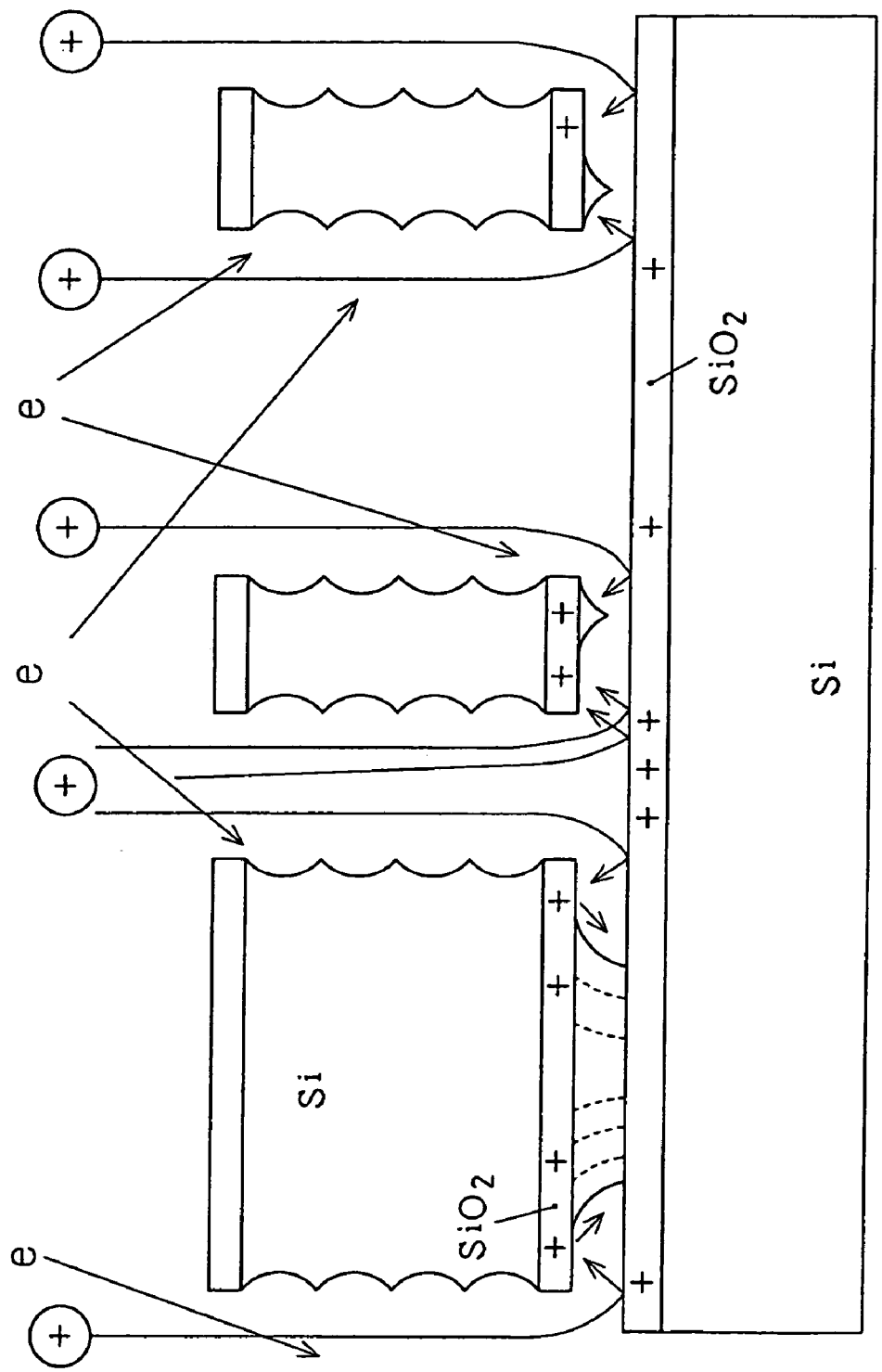
FIG. 8 is a partial cross sectional view explaining the etching process in the method for manufacturing the sensor according to the preferred embodiment.

In this embodiment, as shown in FIG. 8, the intermediate silicon oxide layer, i.e., the insulation layer as the etching stopper is formed on the bottom of the movable-portion-to-be-formed region. Thus, the silicon layer disposed under the movable-portion-to-be-formed region is etched selectively by the dry-etching method so that the cavity 10 extending in the horizontal direction is formed. Thus, the movable portion of the beam structure 14 becomes movable. Accordingly, the cross section of the movable portion becomes a rectangular shape. Further, the height of the cavity 10 under the movable portion is secured accurately. The height of the cavity 10 is a clearance. Further, the intermediate silicon oxide layer as the etching stopper charges positively by the etching ion so that the charged intermediate silicon oxide layer assists to etch the sidewall of the silicon layer in the horizontal direction. Further, the sidewall of the silicon layer neighboring to a narrow groove is prevented from over etching. Therefore, the silicon layer sandwiched between wide grooves can be etched appropriately so that the movable portion between the wide grooves is separated from the embedded oxide film 3. Thus, the cavity having the predetermined height is formed under the movable portion between the wide grooves. Thus, the pattern of the mask for forming the sensor can have design degree of freedom. Further, by controlling the thickness of the first silicon layer 50, the height of the cavity 10 is easily controlled accurately. The thickness of the first silicon layer 50 defines the height of the intermediate silicon oxide layer as the etching stopper, which is embedded in the silicon layer 4.

Improvement of line width dependency and suppression of contact between the substrate 2 and the movable portion are described as follows. The improvement of the line width dependency is such that the movable portion can be formed appropriately without being affected by the width of the groove W1, W2. The suppression of the contact is such that the clearance between the movable portion and the embedded oxide film 3 is set to be larger so that the movable portion is prevented from contacting the embedded oxide film 3 in the vertical direction. Here, preferably, the clearance between the movable portion and the substrate 2 is set to be larger. This is because air-dumping effect between the movable portion and the embedded oxide film 3 is reduced when the clearance is large.

Figure 21A:
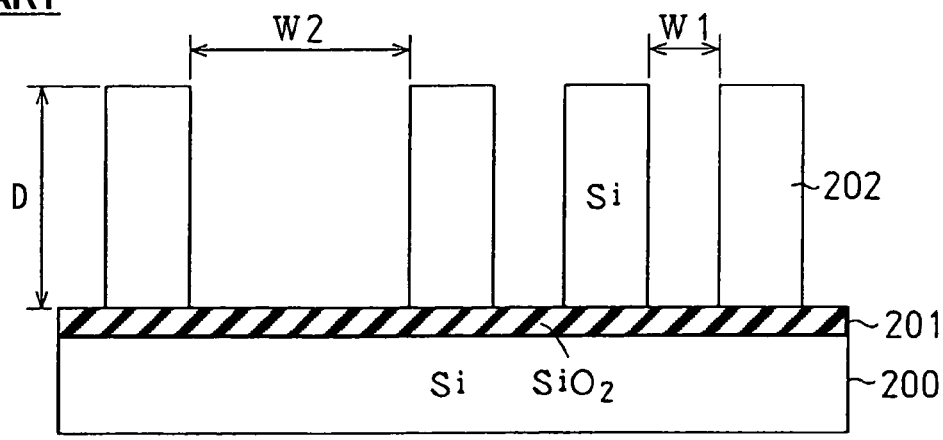
FIGS. 21A to 21C are cross sectional views explaining the method for manufacturing the semiconductor acceleration sensor according to the related art.
Figure 21B:
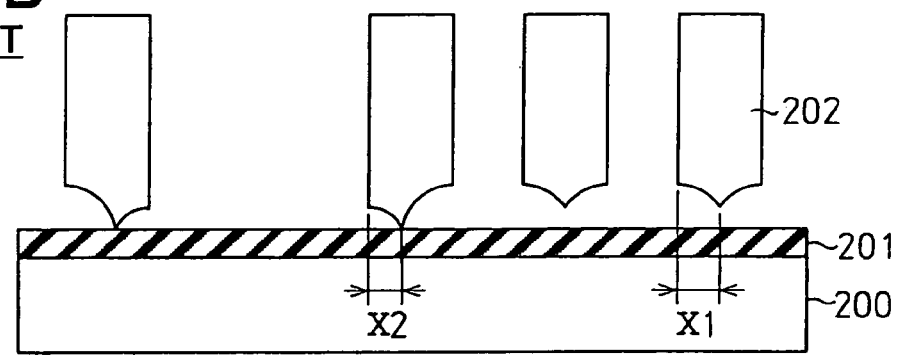
Figure 21C:
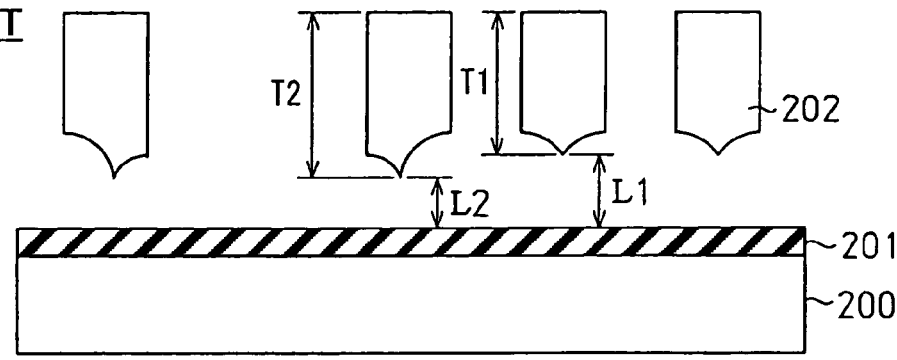

In the prior art, the clearance between the movable portion and the embedded oxide film 3 is controlled by the etching time. Therefore, as shown in FIG. 21C, after the etching is performed, the height of the cavity is different, so that an initial capacitance in case of no physical quantity applied is not accurately determined.

However, in the present embodiment, the etching stopper is disposed in the silicon layer 4 so that the movable portion is accurately formed. Thus, the sidewall of the first silicon layer is completely removed so that the line width dependency is reduced. Further, the initial capacitance is accurately determined. The initial capacitance is obtained in a case where no physical quantity is applied. Further, the height of the clearance can be freely designed. For example, when the clearance becomes wider, parasitic capacitance between the movable portion and the substrate 2 becomes smaller.

In the construction of the semiconductor acceleration sensor, the intermediate silicon oxide layer is disposed on the roof of the cavity 10 in the silicon layer 4. When the first silicon layer 50 disposed under the movable-portion-to-be-formed region is etched for forming the cavity 10, the intermediate silicon oxide layer works as the etching stopper. Thus, the height of the movable portion from the embedded oxide film 3 becomes constant. Thus, the height of the cavity 10 becomes constant. Specifically, the embedded oxide film 3 and the intermediate silicon oxide layer are disposed under the movable-portion-to-be-formed region work as two etching stoppers when the movable portion is separated from the embedded oxide film 3. The first silicon layer disposed between two etching stoppers is anisotropically etched so that the movable portion is released. The movable portion is provided by the cavity 10 having the constant and homogeneous height.

Even when the widths of the grooves 12a-12d are different, the cavity 10 having the homogeneous height is formed. Thus, the movable portion having a predetermined shape is formed accurately. Thus, it is easy to control capacitance design. Further, the design degree of freedom in the pattern of the sensor is improved.

The manufacturing method of the semiconductor acceleration sensor includes the first to third steps. The first step is such that the multi-layered substrate 1 having the intermediate silicon oxide layer 40 embedded in the substrate 1 is prepared. The intermediate silicon oxide layer 40 is disposed at least on the bottom of the movable-portion-to-be-formed region in the silicon layer 4. The intermediate silicon oxide layer 40 becomes the roof of the cavity 10. The second step is such that the second silicon layer 51 in the multi-layered substrate 1 is etched from the surface of the substrate 1 so that the groove 53 is formed. The groove 53 extends in the vertical direction of the substrate 1, and reaches the embedded oxide film 3. The third step is such that the first silicon layer 50 dispose between the embedded oxide film 3 and the intermediate silicon oxide layer 40 is etched from the bottom of the groove 53 with using the embedded oxide film 3 and the intermediate silicon oxide layer 40 as the etching stopper. Thus, the cavity 10 extending in the horizontal direction is formed so that the movable portion is formed. In this case, the height of the cavity 10 becomes constant.

Here, in the first step, the multi-layered substrate 1 is prepared such that the embedded oxide film 3 as the embedded insulation film, the first silicon layer 50 as the semiconductor layer, the intermediate silicon oxide layer 40 as the roof insulation film, and the second silicon layer 51 as the semiconductor layer are deposited on the silicon substrate 2 in this order. Thus, the multi-layered substrate 1 is easily prepared.

The multi-layered substrate 1 can be prepared by other methods.

Figure 10A:
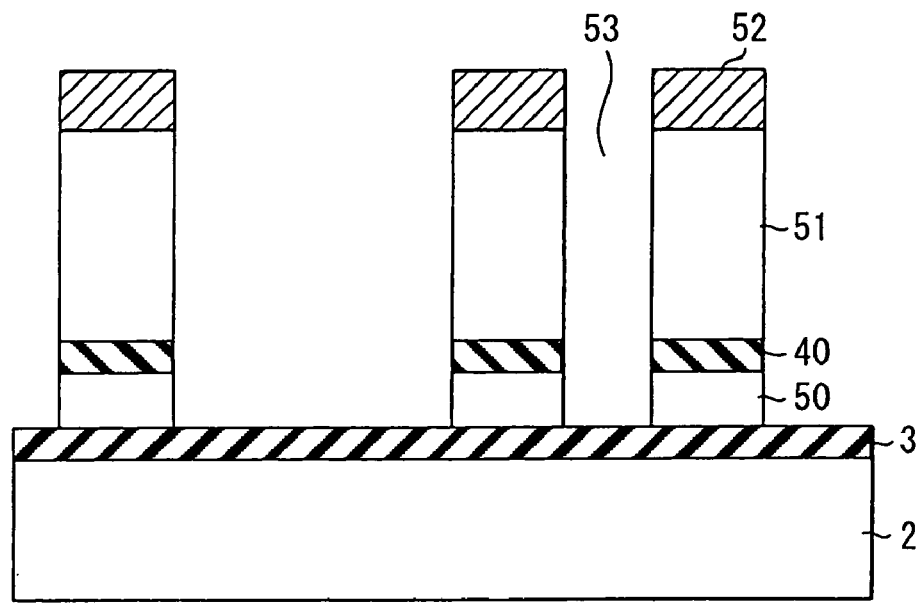
FIGS. 10A and 10B are cross sectional views explaining the method for manufacturing the sensor according to the first modification of the preferred embodiment.
Figure 10B:
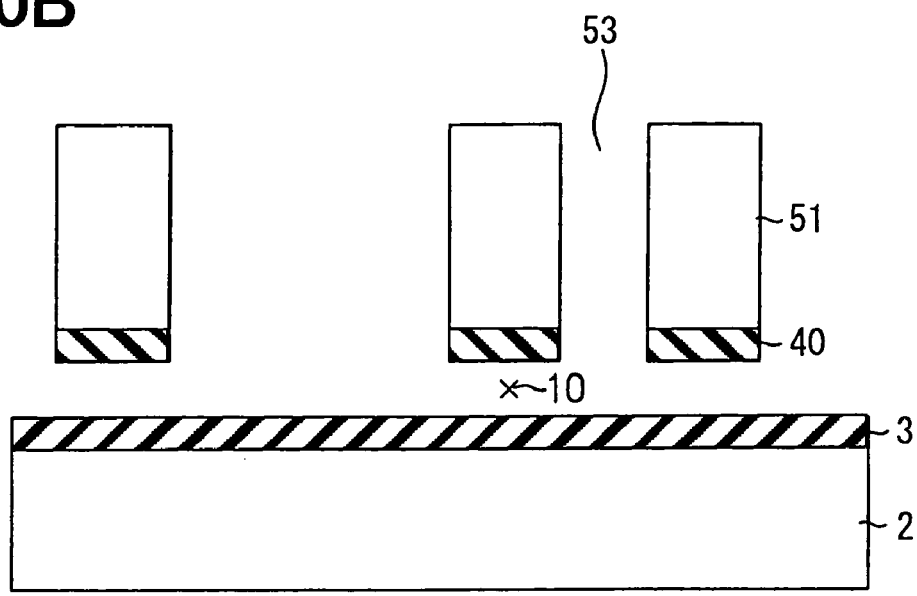

For example, as shown in FIG. 9A, two substrates 60, 65 are bonded each other so that the multi-layered substrate 1 is prepared. The intermediate silicon oxide layer 40 having a predetermined pattern is embedded one substrate 65. Specifically, as shown in FIG. 9A, the first substrate 60 includes the silicon substrate 2, the embedded oxide film 3 and the first silicon layer 50 so that the first substrate 60 is the SOI substrate. The second substrate 65 includes the intermediate silicon oxide layer 40 disposed on the surface of the second substrate 65. The intermediate silicon oxide layer 40 is embedded in the second substrate 65 at a predetermined position, which becomes the roof of the cavity 10. The first substrate 60 and the second substrate 65 are bonded each other so that the multi-layered substrate 1 is prepared. Then, as shown in FIG. 9C, the mask 52 is formed on the surface of the multi-layered substrate 1. As shown in FIG. 10A, the groove 53 is formed in the silicon layer 4 by the trench etching method so that the groove 53 reaches the embedded oxide film 3. The silicon layer 4 is etched in such a manner that the trench etching is performed to avoid the intermediate silicon oxide layer as the etching stopper. Thus, as shown in FIG. 10B, the cavity 10 is formed such that the first silicon layer between the embedded oxide film 3 and the intermediate silicon oxide layer 40 is etched in the horizontal direction from the bottom of the groove 53. Thus, the movable portion of the beam structure 14 becomes movable.

Figure 11A:
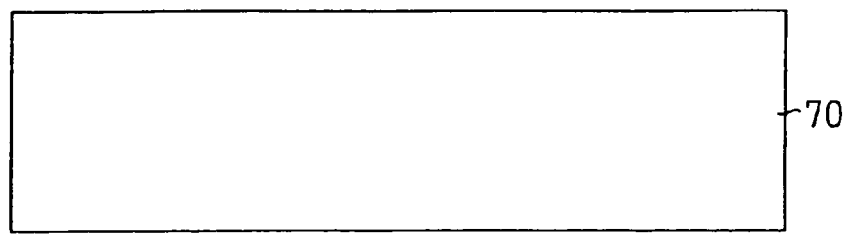
FIGS. 11A to 11D are cross sectional views explaining a method for manufacturing a multi-layered substrate in the manufacturing method of the sensor according to a second modification of the preferred embodiment.
Figure 11B:
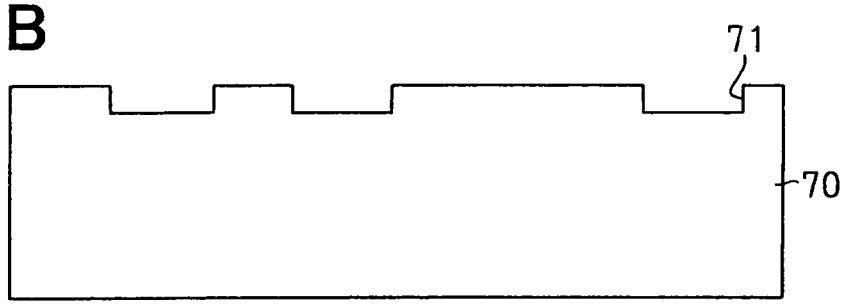
Figure 11C:
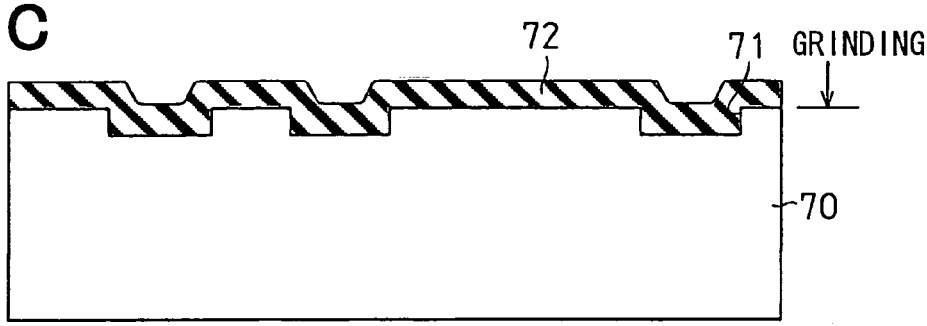
Figure 11D:
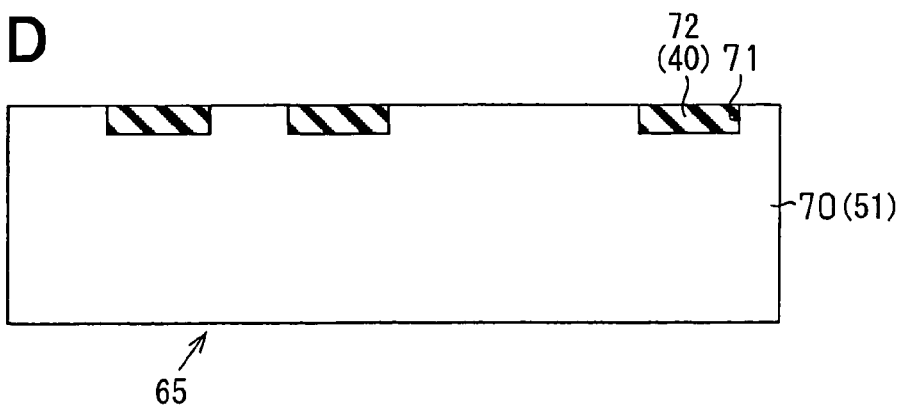

Here, the manufacturing method of the second substrate 65 is described as follows. As shown in FIG. 11A, a silicon substrate 70 is prepared. Then, a groove 71 is formed at a predetermined position. Further, as shown in FIG. 1C, a silicon oxide film 72 as the intermediate silicon oxide layer 40 is deposited on the substrate 70 to fill the groove 71. Further, the surface of the substrate 70 is grinded by a CMP method. Thus, as shown in FIG. 1D, the intermediate silicon oxide layer 40 is embedded in the substrate 70 so that the second substrate 65 is formed. The intermediate silicon oxide layer 40 is disposed on a predetermined region on the surface of the substrate 65.

Figure 12A:
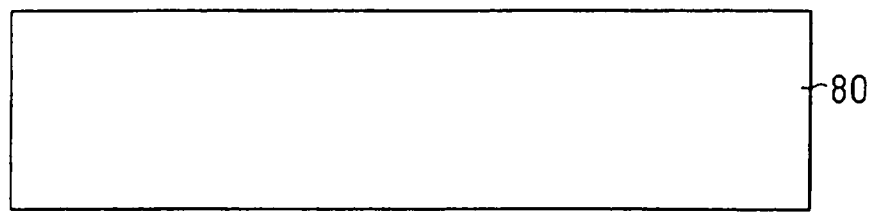
FIGS. 12A to 12D are cross sectional views explaining a method for manufacturing the multi-layered substrate in the manufacturing method of the sensor according to a third modification of the preferred embodiment.
Figure 12B:
Figure 12C:
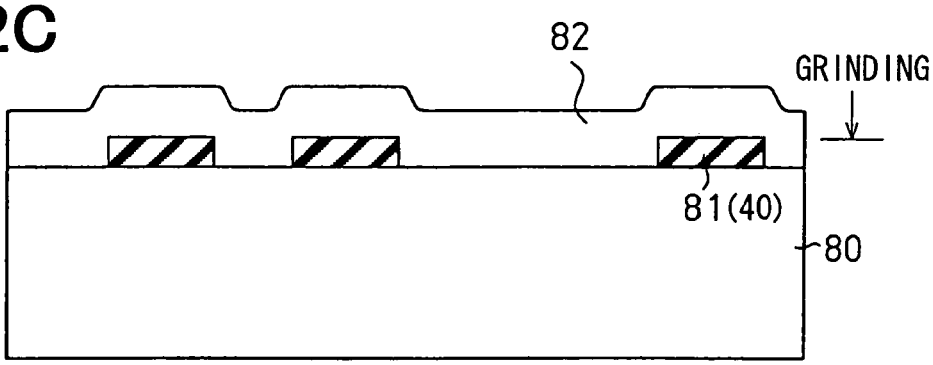
Figure 12D:
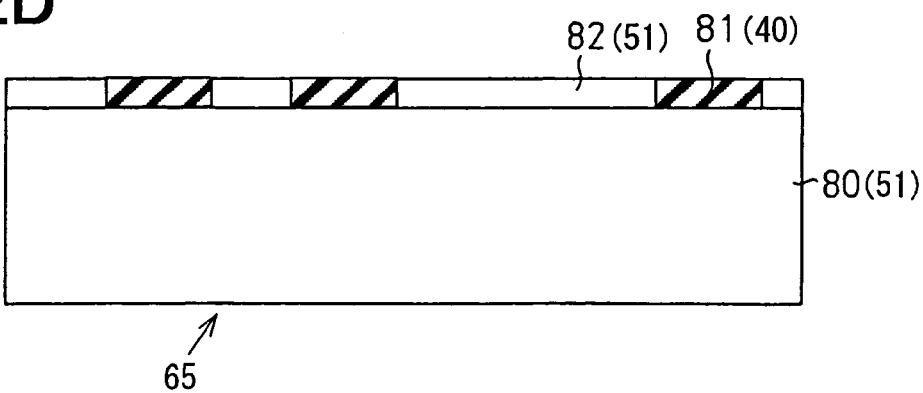

Another method of manufacturing the second substrate 65 is as follows. As shown in FIG. 12A, a silicon substrate 80 is prepared. A silicon oxide film 81 as the intermediate silicon oxide layer 40 having a predetermined pattern is formed on the substrate 80. As shown in FIG. 12C, an epitaxial film 82 is formed on the substrate 80 so that a concavity between the silicon oxide film 81 is filled with the epitaxial film 82. Then, the surface of the substrate 80 is polished so that the second substrate 65 is formed.

Figure 13A:
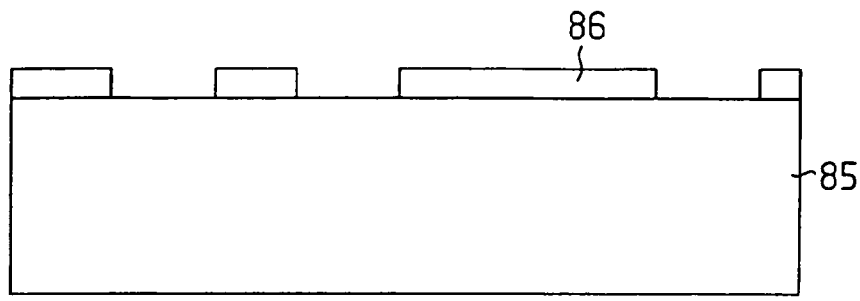
FIGS. 13A and 13B are cross sectional views explaining a method for manufacturing the multi-layered substrate in the manufacturing method of the sensor according to a fourth modification of the preferred embodiment.
Figure 13B:
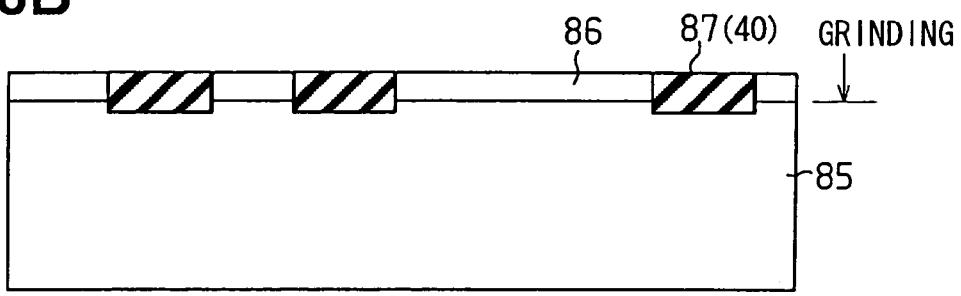

The third method of manufacturing the second substrate 65 is as follows. As shown in FIG. 13A, a silicon substrate 85 is prepared. An insulation film 86 as a mask is formed on the surface of the substrate 85. The insulation film 86 has a predetermined pattern. Then, the surface of the substrate 85 is thermally oxidized so that a thermal oxidation film 87 is formed on the exposed surface of the substrate 85 without the insulation film 86. Then, the surface of the substrate 85 is grinded so that the second substrate 65 is formed. The thermal oxidation film 87 works as the intermediate silicon oxide layer 40.

Figure 14:
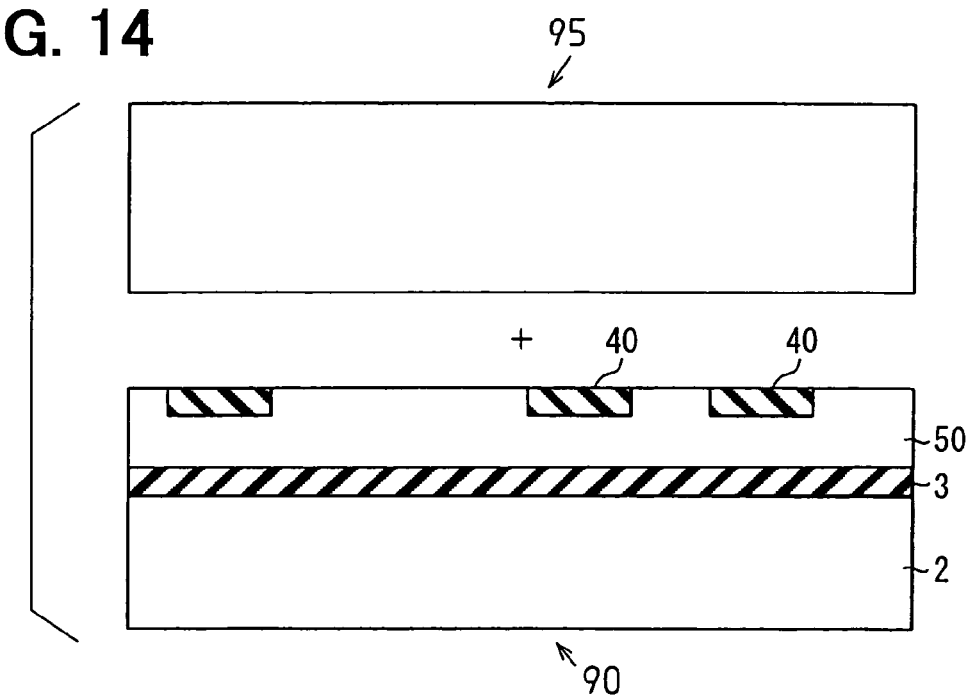
FIG. 14 is a cross sectional view explaining a method for manufacturing the sensor according to a fifth modification of the preferred embodiment.

Further, although the first and the second substrates 60, 65 are bonded each other so that the multi-layered substrate 1 is formed, the multi-layered substrate 1 can be manufactured by other methods. For example, as shown in FIG. 14, the multi-layered substrate 1 is formed in such a manner that the first substrate 90 and the second substrate 95 are bonded each other. The first substrate 90 includes the silicon substrate 2, the embedded oxide film 3, the first silicon layer 50 and the intermediate silicon oxide layer 40. The intermediate silicon oxide layer 40 is disposed on the surface of the first substrate 90 at a predetermined position. The second substrate 95 is a bulk silicon substrate. The first and the second substrates 90, 95 are bonded each other so that the multi-layered substrate 1 is formed. The first substrate 90 can be formed by a combination of the above methods shown in FIGS. 11A to 13B. Thus, the intermediate silicon oxide layer 40 is embedded in the first substrate 90.

Although the intermediate silicon oxide layer 40 as the etching stopper is made of a silicon oxide film, the etching stopper as an intermediate insulation film can be formed from other oxide films and other nitride films. Further, the silicon layer 4 and the silicon substrate 2 can be made of silicon single crystal or silicon poly crystal. Further, although the sensor is the acceleration sensor, other sensors such as an angular rate sensor and an angular acceleration sensor can be manufactured by the above method.

The weight portion 24 can have a through hole for assisting formation of the cavity 10. The through hole penetrates the weight portion in the vertical direction. Etchant or etching gas can be easily introduced into the cavity 10 through the through hole.

Figure 15:
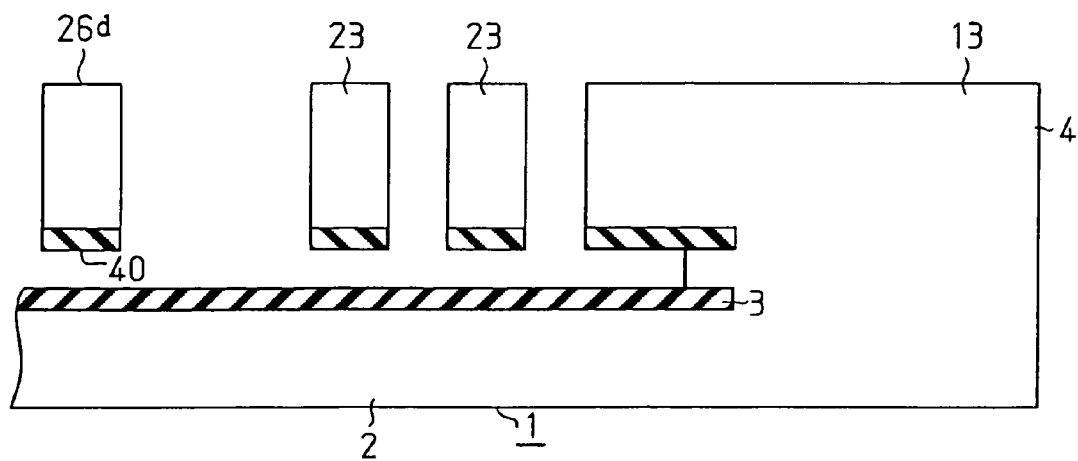
FIG. 15 is a cross sectional view showing a semiconductor acceleration sensor according to a sixth modification of the preferred embodiment.

Further, as shown in FIG. 15, it is not necessary to form the embedded oxide film 3 as the embedded insulation film in a portion between the silicon substrate 2 as the support substrate and the silicon layer 4 as the semiconductor layer, in other words, the portion that does not require electrical insulation. Specifically, the square frame 13 disposed on the periphery of the sensor does not require electric insulation. Accordingly, the square frame 13 has the same electric potential as the silicon substrate 2. Further, no cavity 10 is formed in the portion. Therefore, no embedded oxide film 3 is disposed in the portion, in which the electric insulation is not required. Thus, stress caused by the embedded oxide film 3 is reduced, the stress may cause curvature deformation of the substrate 1. Further, in FIG. 15, no intermediate silicon oxide layer 40 is embedded in the substrate 1.

Further, the embedded oxide film 3 is not formed on the bottom of the cavity 10. Specifically, the intermediate silicon oxide layer 40 as the insulation film can be formed at least on the roof of the cavity 10, which provides the movable portion. In this case, the intermediate silicon oxide layer 40 works as the etching stopper when the cavity 10 is formed by etching a part of the silicon substrate, which is disposed under the movable-portion-to-be-formed region. Therefore, the height of the cavity 10 becomes homogeneous and constant. In this case, the manufacturing method of the substrate 1 is described as follows.

Figure 16:
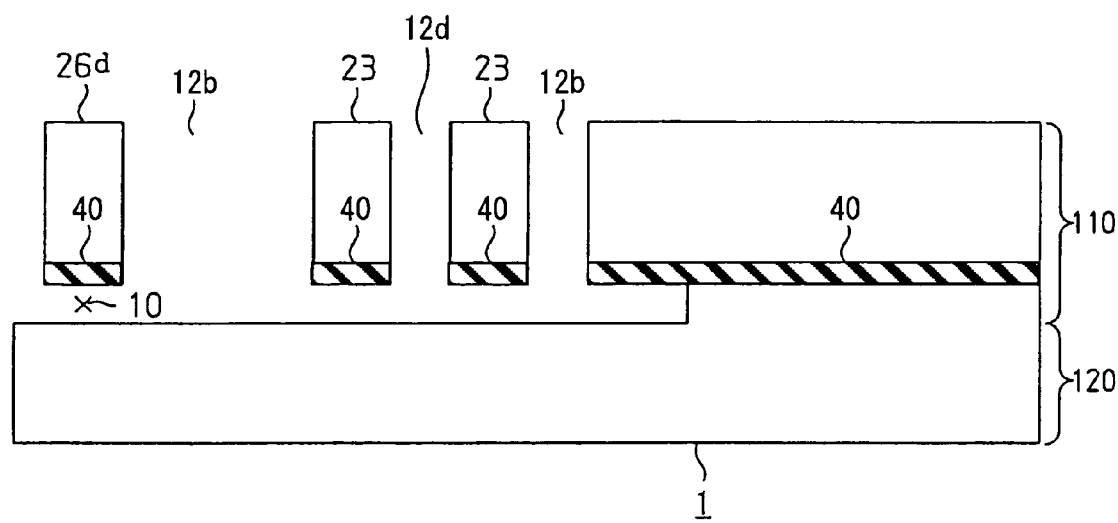
FIG. 16 is a cross sectional view showing a semiconductor acceleration sensor according to a seventh modification of the preferred embodiment.
Figure 17:
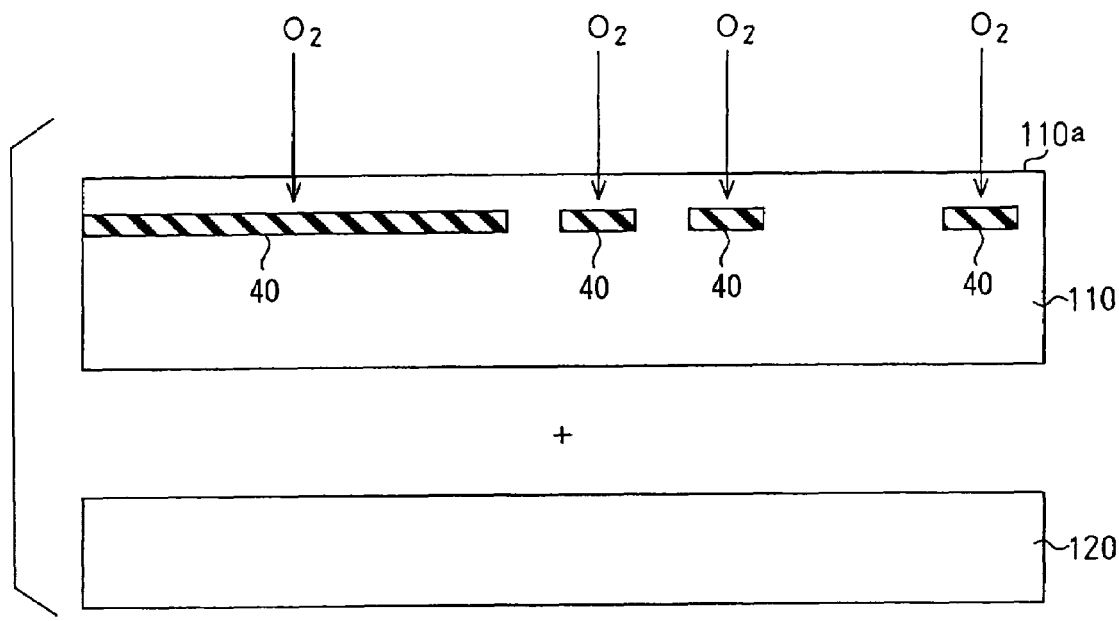
FIG. 17 is a cross sectional view explaining a method for manufacturing the sensor according to the seventh modification of the preferred embodiment.
Figure 18:
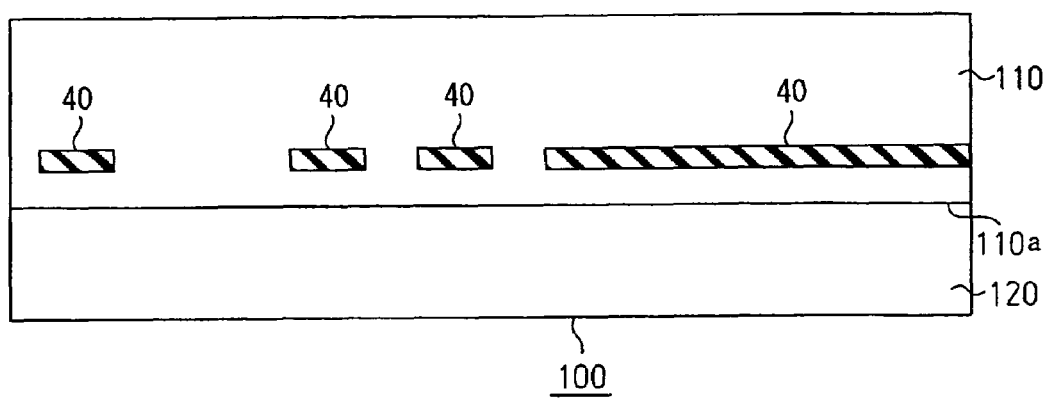
FIG. 18 is a cross sectional view explaining the method for manufacturing the sensor according to the seventh modification of the preferred embodiment.
Figure 19:
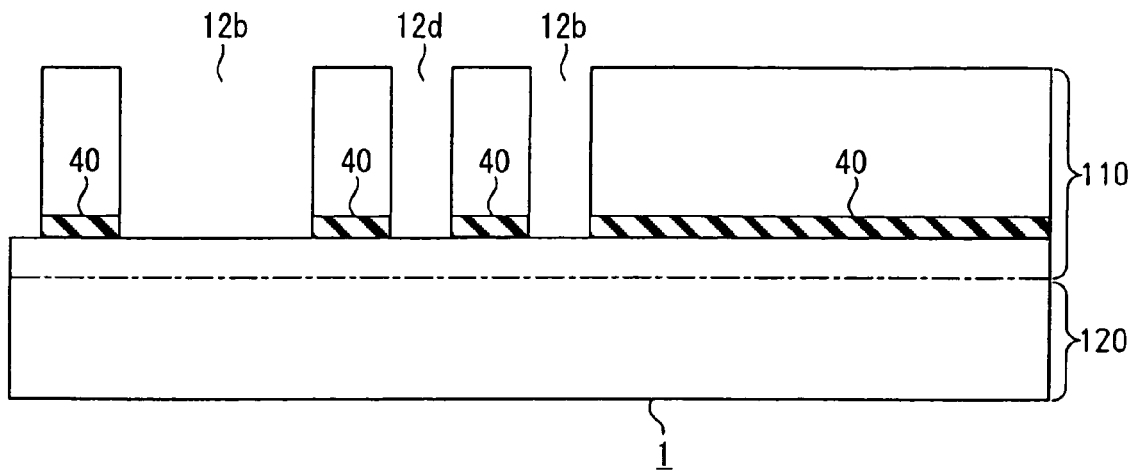
FIG. 19 is a cross sectional view explaining the method for manufacturing the sensor according to the seventh modification of the preferred embodiment.
Figure 20A:
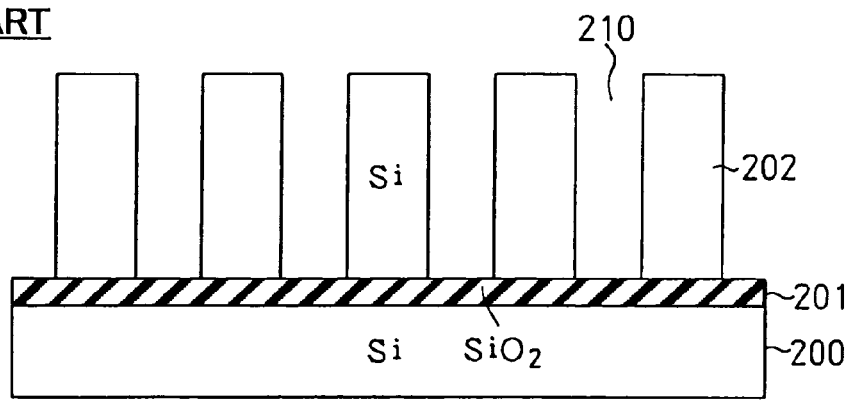
FIGS. 20A and 20B are cross sectional views explaining a method for manufacturing a semiconductor acceleration sensor according to a related art.
Figure 20B:
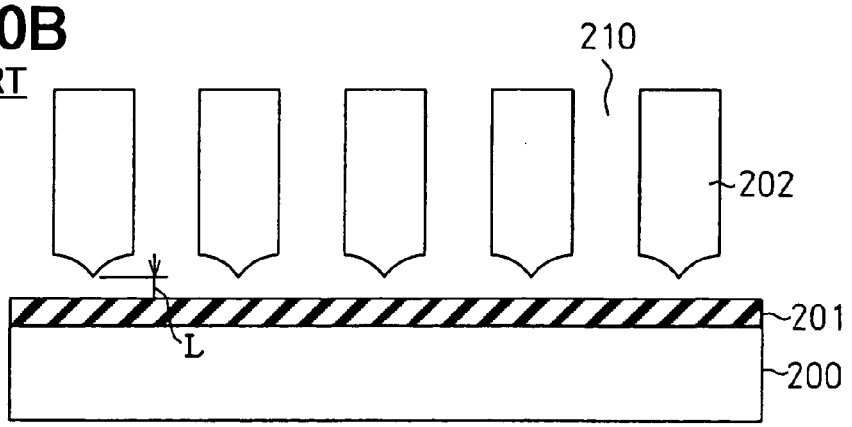

As shown in FIG. 18, in the first step, the multi-layered substrate 1 is prepared, which includes the intermediate silicon oxide layer 40 embedded in the substrate 1. The intermediate silicon oxide layer 40 as the roof insulation film is disposed on a cavity-roof-to-be-formed region. Specifically, as shown in FIG. 17, the first substrate 110 including the intermediate silicon oxide layer 40 embedded in the substrate 110 by a SIMOX (i.e., separation by implantation of oxygen) method is prepared. Further, the second substrate 120 as the semiconductor substrate is prepared. Then, an ion implantation surface of the first substrate 110 is bonded to the second substrate 120. Then, in the second step, the grooves 12a-12d are formed from the top of the first substrate 110, as shown in FIG. 19. The grooves 12a-12d penetrate the intermediate silicon oxide layer 40 in the vertical direction of the substrate 1. Further, in the third step, as shown in FIG. 16, a part of the first substrate 110 is isotropically etched by using the intermediate silicon oxide layer 40 as the etching stopper so that the cavity 10 is formed in the horizontal direction. Thus, the movable portion is formed. Specifically, the part of the first substrate disposed under the intermediate silicon oxide layer 40 is isotropically etched so that a predetermined thickness of the part of the first substrate 110 is removed. Thus, the movable portion is released. Accordingly, the movable portion has a homogeneous height from the second substrate 120. Here, the isotropic etching can be performed by the dry-etching method or a wet-etching method. It is preferred that the isotropic etching is performed by the dry-etching method. This is because a sticking effect is prevented in case of the dry-etching method. The sticking effect is such that the movable electrode 25a-25d, 26a-26d is adhered to the fixed electrode 15a-15d, 16a-16d.

Here, although the first substrate 110 including the intermediate silicon oxide layer 40 embedded therein is bonded to the second substrate 120, only the first substrate 110 can be used as the multi-layered substrate 1 without bonding the second substrate 120. Thus, at least the first substrate 110 including the intermediate silicon oxide layer 40 as the cavity roof insulation film is used for the multi-layered substrate 1. The intermediate silicon oxide layer 40 is embedded in the substrate 1 by the SIMOX method.

Such changes and modifications are to be understood as being within the scope of the present invention as defined by the appended claims.

What is claimed is:

1. A physical quantity sensor comprising:
   a support substrate;
   an embedded insulation film disposed on the substrate;
   a semiconductor layer disposed on the embedded insulation film;
   a cavity disposed between the semiconductor layer and the embedded insulation film and extending in a horizontal direction of the substrate;
   a groove portion disposed in the semiconductor layer and reaching the cavity; and
   a movable portion disposed in the semiconductor layer and separated from the embedded insulation film by the cavity and the groove portion, wherein
   the movable portion includes an intermediate insulation layer disposed on a bottom of the movable portion.

2. The sensor according to claim 1, wherein
   the groove portion includes a plurality of grooves having different widths.

3. The sensor according to claim 1, wherein
   the embedded insulation film is not disposed on a part of the substrate, the part requiring no electric insulation between the substrate and the semiconductor layer.

* * * * *